United States Patent
Parekhji et al.

(10) Patent No.: US 8,839,063 B2
(45) Date of Patent: Sep. 16, 2014

(54) CIRCUITS AND METHODS FOR DYNAMIC ALLOCATION OF SCAN TEST RESOURCES

(71) Applicant: Texas Instruments Incorporated, Dallas, TX (US)

(72) Inventors: Rubin Ajit Parekhji, Bangalore (IN); Srivaths Ravi, Bangalore (IN); Prakash Narayanan, Bangalore (IN); Milan Shetty, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 13/749,623

(22) Filed: Jan. 24, 2013

(65) Prior Publication Data

US 2014/0208177 A1 Jul. 24, 2014

(51) Int. Cl.
*G01R 31/28* (2006.01)
*G06F 11/00* (2006.01)

(52) U.S. Cl.
USPC .......................................... 714/742; 714/738

(58) Field of Classification Search
USPC ................................. 714/742, 738
See application file for complete search history.

(56) References Cited

U.S. PATENT DOCUMENTS

| | | | | |
|---|---|---|---|---|
| 5,195,050 A * | 3/1993 | Hsu et al. | ....................... | 708/420 |
| 5,383,143 A * | 1/1995 | Crouch et al. | ................ | 708/254 |
| 5,654,971 A * | 8/1997 | Heitele et al. | ................. | 714/735 |
| 5,732,246 A * | 3/1998 | Gould et al. | .................... | 326/38 |
| 5,867,507 A * | 2/1999 | Beebe et al. | ..................... | 714/726 |
| 5,991,909 A * | 11/1999 | Rajski et al. | .................. | 714/729 |
| 6,327,687 B1 * | 12/2001 | Rajski et al. | .................. | 714/738 |
| 7,028,239 B2 | 4/2006 | Jaber | | |
| 7,237,162 B1 * | 6/2007 | Wohl et al. | ..................... | 714/726 |
| 7,487,419 B2 | 2/2009 | Mukherjee et al. | | |
| 2005/0060626 A1 * | 3/2005 | Rajski et al. | .................. | 714/728 |
| 2012/0110402 A1 | 5/2012 | Wang et al. | | |

* cited by examiner

*Primary Examiner* — M. Mujtaba K Chaudry
(74) *Attorney, Agent, or Firm* — Ronald O. Neerings; Frederick J. Telecky, Jr.

(57) ABSTRACT

A method of testing devices under test (DUTs) and testing system are disclosed. The method comprises generating at least one control signal associated with a test pattern structure received from a testing system. The method further comprises selecting M1 number of ports from M number of I/O ports in the DUT to receive scan input corresponding to the test pattern structure based on the control signal, selecting M2 number of ports from the M number of I/O ports to provide scan output based on the control signal, wherein each of M1 and M2 is a number selected from 0 to M, and wherein a sum of M1 and M2 is less than or equal to M. Thereafter, the method comprises performing a scan testing of the DUT based on the scan input provided to the M1 number of ports and receiving the scan output from the M2 number of ports.

20 Claims, 5 Drawing Sheets

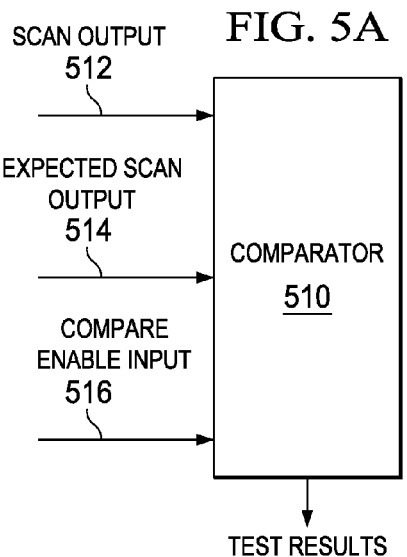
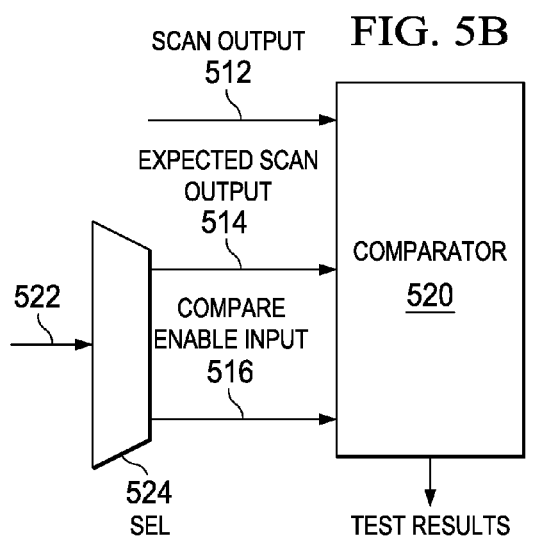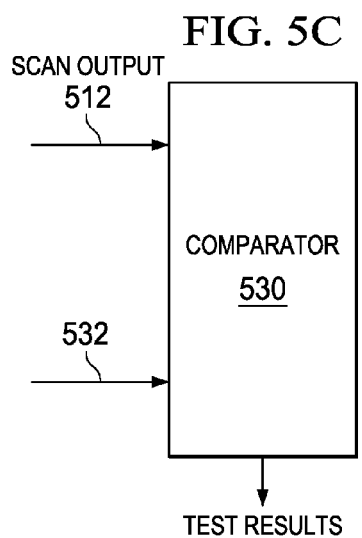

CIRCUITS AND METHODS FOR DYNAMIC ALLOCATION OF SCAN TEST RESOURCES

TECHNICAL FIELD

The present disclosure generally relates to scan testing of semiconductor devices such as Integrated Circuits (ICs).

BACKGROUND

In an exemplary scenario, the testing of semiconductor designs may be an integral step in the manufacturing process, and may involve a variety of challenges, such as, for example, using exhaustive test patterns and, at the same time, reducing overall test time and the cost involved in the testing of the designs. Some exemplary techniques for reducing the test time and cost involved in testing may include designing the devices under test (DUTs) with adequate design for testability (DFT) techniques that are amenable for Automatic Test Pattern Generation (ATPG) and ATPG tools so as to support a test application using different testers. Examples of some testers may include a very low cost tester (VLCT) or high-end testers.

In various exemplary scenarios, a majority of the hardware implementations in DUTs for the tester, as well as for the correct operation with ATPG tool generated patterns, perform scan-in shift and scan-out shift operations in tandem. In various cases, a desired controllability (based on the scan-in operation) and desired observability (based on scan-out operations) may be different, and, in such cases, some test cycles and associated resources may not be fully utilized. An example of such a case may include the testing of multiple, identical/non-identical cores. For instance, in certain devices, the quantity of data that is to be shifted in is not necessarily the same as the quantity of data that is to be shifted out on a per test pattern basis. Another example (where the desired controllability and the desired observability may be different) of such a case is where portions of the scan channels are to be scanned in or scanned out. Another such case may be where the same scan-in value in a particular module can be used to test for faults in other adjacent modules across more than one test pattern. Another case is where the initialization of several modules may require several scan-in operations in order to set the states of the individual scan chains of different modules, while the observation of a fewer number of scan chains may be sufficient on a per pattern basis in order to obtain the targeted coverage.

Further, as Input/Output (I/O) ports of the DUTs are coupled with corresponding ports of the tester, the frequency of the clock which controls the scan-in or scan-out shift operations is constrained by (1) the speed of the data transfer in the tester scan channels and (2) the matching of the DUT I/Os with the loads seen on the testing system's boards for this clock frequency. In various scenarios, the DUT's output ports may not have sufficient drive strength to drive the load on the connection between the DUT and the VLCT, and the low strength I/Os may impair shift speed and may also impact test time.

SUMMARY

This Summary is provided to introduce a selection of concepts in a simplified form that are further described below in the detailed description. This Summary is not intended to identify key or essential features of the claimed subject matter, nor is it intended to be used as an aid in determining the scope of the claimed subject matter.

Various methods, configurations of DUTs and testing systems for scan testing of devices under test (DUTs) are disclosed. At least one DUT comprises N number of scan channels associated with M number of Input/Output (I/O) ports, wherein both N and M are integer values. A method of testing devices under test (DUTs) comprises generating at least one control signal associated with a test pattern structure, wherein the test pattern structure is received from a testing system for scan testing of the at least one DUT. The method further comprises selecting M1 number of ports from among the M number of I/O ports to receive a scan input corresponding to the test pattern structure based on the at least one control signal. The method further comprises selecting M2 number of ports from among the M number of I/O ports to provide a scan output corresponding to the test pattern structure based on the at least one control signal, wherein each of the M1 and M2 is a number (e.g., an integer value) selected from 0 to M, and wherein a sum of M1 and M2 is less than or equal to M. Thereafter, the method comprises performing scan testing of the at least one DUT based on providing the scan input to the M1 number of ports and receiving the scan output from the M2 number of ports.

In an embodiment, the method further comprises communicatively coupling N1 number of scan channels from among the N number of scan channels with the M1 number of ports in order to perform a scan-in shift operation corresponding to the scan input based on the at least one control signal. The method further comprises communicatively coupling N2 number of scan channels from among the N number of scan channels with the M2 number of ports in order to perform a scan-out shift operation corresponding to the scan output based on the at least one control signal. Since M1 ports are used to shift in scan input data, and since M2 ports are used to shift out scan output data, the M ports are connected to N internal scan channels, wherein both implementations, with and without scan compression, are provided in various embodiments.

Additionally, in an embodiment, a DUT capable of being scan tested by a testing system is disclosed. The DUT comprises M number of Input/Output (I/O) ports, wherein each I/O port is capable of being operated as a port for receiving a scan input corresponding to a test pattern structure and providing a scan output corresponding to the test pattern structure. The DUT further comprises a plurality of scan channels communicatively coupled with the M number of I/O ports such that these scan channels are configured to receive the scan input and provide the scan output. The DUT further comprises a selection circuit communicably coupled with each of the M number of I/O ports and the plurality of scan channels. The selection circuit is configured to select M1 number of ports from among the M number of I/O ports in order to receive the scan input based on at least one control signal and select M2 number of ports from among the M number of I/O ports in order to provide the scan output based on at least one control signal, wherein each of M1 and M2 is a number selected from 0 to M, and wherein a sum of M1 and M2 is less than or equal to M.

Moreover, in an embodiment, a testing system configured for testing DUTs is disclosed, wherein at least one DUT comprises N number of scan channels associated with M number of Input/Output (I/O) ports. The testing system comprises a control circuit configured to generate at least one control signal based on a test pattern structure, wherein the test pattern structure is provided to the at least one DUT by the testing system for a scan testing of the at least one DUT. The at least one control signal causes a selection of M1 number of ports from among the M number of I/O ports in order to receive a scan input corresponding to the test pattern structure based on the at least one control signal. The at least one DUT further performs a selection of M2 number of ports from among the M number of I/O ports to provide a scan output corresponding to the test pattern structure based on the at least one control signal, wherein each of M1 and M2 is a number (e.g., an integer value) selected from 0 to M, and wherein a sum of M1 and M2 is less than or equal to M. A scan testing of the at least one DUT is performed based on a provision of the scan input to the M1 number of ports and a receipt of the scan output from the M2 number of ports.

BRIEF DESCRIPTION OF THE FIGURES

FIGS. 5A, 5B and 5C illustrate a number of exemplary comparator configurations in accordance with an embodiment of the present technology;

DETAILED DESCRIPTION

In the following detailed description, numerous specific details are set forth in order to provide a thorough understanding of the present technology. However, the present technology may be practiced without these specific details. In other instances, well-known methods, procedures, components, and circuits have not been described in detail so as to not unnecessarily obscure aspects of the exemplary embodiments presented herein. Moreover, it is noted that structures and devices are shown in block diagram form in order to avoid obscuring the disclosure.

Reference in this specification to "one embodiment" or "an embodiment" means that a particular feature, structure, or characteristic described in connection with the embodiment is included in at least one embodiment of the disclosure. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various parameters are described that may be parameters for some embodiments but not for other embodiments.

Various embodiments of the present technology provide dynamic selection input/output ports as either input ports or output ports in device under tests (DUTs). Various embodiments also provide dynamic selection of scan channels in DUTs for performing scan-in shift operation and/or scan-out shift operation during a scan test. Accordingly, various embodiments provide dynamic allocation of test resources (such as scan channel and I/O ports in the DUTs) for efficient and low cost scan testing of DUTs.

Figure 1:
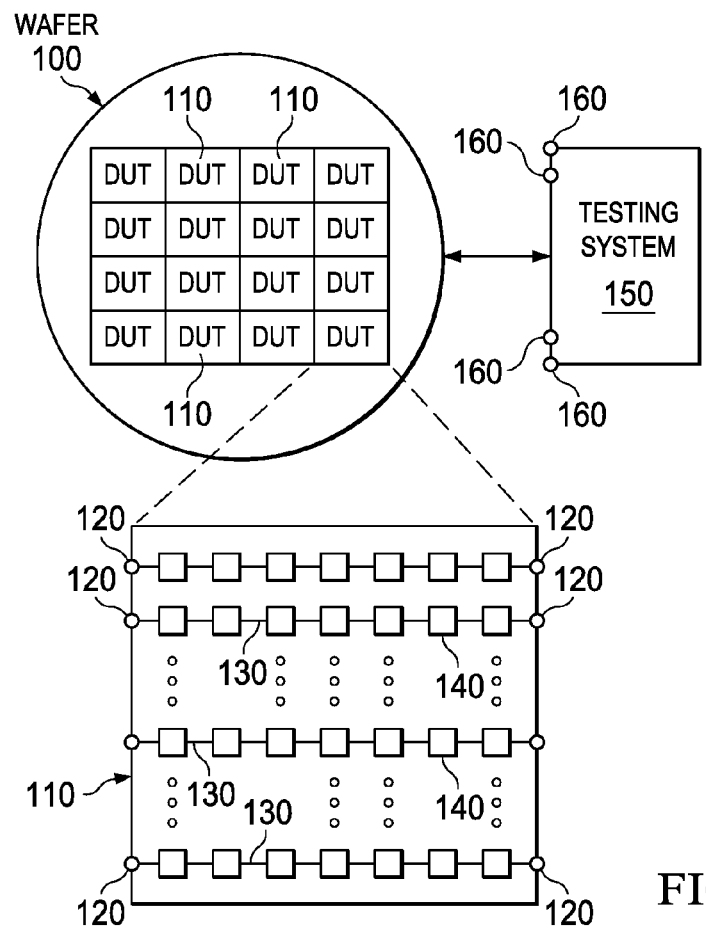
FIG. 1 illustrates an exemplary schematic representation of a plurality of Device Under Tests (DUTs) on a wafer and a testing system in accordance with an exemplary scenario.

FIG. 1 illustrates an exemplary wafer 100 comprising a plurality of dies, in an exemplary scenario. The wafer 100 may be coupled with a testing system such as an ATE (Automatic Test Equipment), which may either be a high-end tester or a Very Low Cost Tester (VLCT) for performing testing of one or more dies present at the wafer 100. In an example, a single die may include one or more devices, and devices may be cut/packaged separately. In an example, one device may have multiple circuits or components or modules that may be coupled to the testing system for performing scan testing of the device. For the purposes of this description, as such, each die may represent a device that may be coupled with the VLCT for the scan testing of the device, and hereinafter, the die is also referred to as a single DUT, although it may contain more than one DUTs.

As shown in FIG. 1, the wafer 100 may include a plurality of DUTs, such as DUTs 110 in the wafer that may be coupled with a testing system 150 for performing a scan testing of the DUTs 110. In an example, the testing system 150 may have a plurality of ports that can be coupled with corresponding ports of the DUTs to perform the scan testing of the multiple DUTs. For instance, in an example, the testing system 150 may have 512 Input/Output (I/O) ports (see, 160), and each DUT may have 32 I/O ports (see, 120), and accordingly, scan testing of 16 such DUTs may be performed simultaneously.

Each DUT of the DUTs 110 may comprise a plurality of scan channels configured for providing scan testing of the DUT. For instance, each DUT having 32 I/O (see, 120) ports may have multiple channels, for example, 16 scan channels (for example, scan channels 130). The scan channels 130 as shown in the FIG. 1, is for exemplary purposed only, and the coupling of the scan channels 130 with the I/O ports 120 may be done in variety of ways using techniques such as with or without scan compression. It should be noted that each scan channel 130 may include a plurality of sequential elements such as scannable flip-flops 140 that can receive inputs in a scan mode or a normal functional mode. It should be noted that number of such scan channels may vary depending upon the configuration of the DUT and the testing system, for example, the 32 I/O ports of the DUT may be communicatively coupled to the scan channels 130 in various ways. In various embodiments of the present technology, scan channels associated (or communicatively coupled) with some I/O ports of 32 I/O ports may be used as scan channels that receive scan inputs provided by the testing system 150, whereas scan channels associated with some I/O ports of the 32 I/O ports may be used as scan channels that provide scan output for determining any fault in the DUT. In some example, a same scan channel may be utilized for the receiving the scan input as well as providing the corresponding scan output. Such embodiments are described in reference to FIGS. 2 to 7. As such, it should be understood that various embodiments of the present technology provide dynamically allocating scan-in channels and scan-out channels while testing of the DUTs, as the number of input ports and output ports are not fixed, and can be dynamically varied on a per test mode, on a per test pattern and on a per test cycle basis. Herein, term 'scan-in channels' may be referred for scan channels that receive scan input and on which scan-in shift operation may be performed. Herein, term 'scan-out channels' may be referred for scan channels that provide scan outputs associated with scan-out shift operation, and their output (for example, the scan output) may be compared with expected scan output for the determining any fault or diagnosis of DUTs. It should be noted that in some implementations, for example, in the presence of scan compression, the scan channels that are communicatively coupled with the I/O ports may be different from internal scan chains depending upon the hook-up configuration of the internal scan chains to the I/O ports of the DUT.

Figure 2:
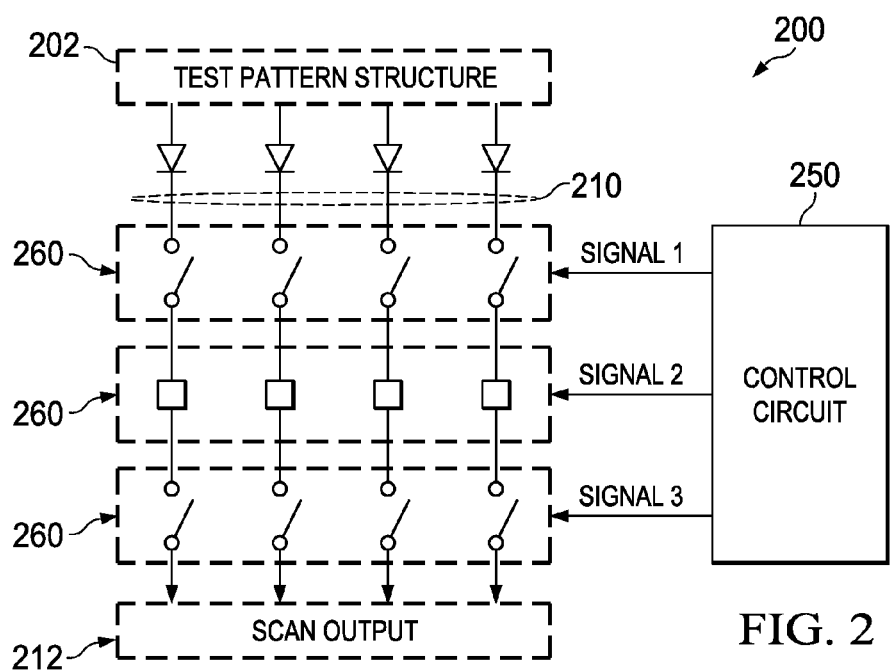
FIG. 2 illustrates an exemplary DUT in accordance with an exemplary embodiment of the present technology.

FIG. 2 illustrates an exemplary DUT 200, in accordance with an embodiment. The DUT 200 may have a plurality of scan channels (for example, scan channels 130) associated with I/O ports. The I/O ports may be same as the I/O ports 120, as shown in reference to FIG. 1. In an example, a varying number of I/O ports may be used as either input port for receiving scan input or as output port for providing scan output (shown as 212) on a per test pattern structure (shown as 202). Herein, the term "test pattern structure" may refer to a test pattern, or a test cycle of a plurality of test cycles of the test pattern, or a test mode comprising multiple test patterns. For example, if there are M number of I/O ports present in the DUT, M number of I/O ports from among the M number of I/O ports may be selected as input port and M2 number of I/O ports may from among the M number of I/O ports may be selected as output port. In an example, M1 may vary in a range from 0 to M and M2 may vary from a range from 0 to M, and for a particular test pattern structure, a total of M1 and M2 is equal to M. For instance, if there are 32 scan I/O ports, 20 ports may be selected as input port and the remaining 12 ports may be selected as output ports. In this example, scan inputs corresponding to test pattern structures (including a particular test cycle of a test pattern, the test pattern or a test mode comprising the test pattern) may be provided at the 20 input ports and scan-in shift operation may be performed at scan channels communicatively coupled with the 20 input ports. In this example, scan outputs (shown as 212) corresponding to the test pattern structures (shown as 202) may be received from the 12 ports that are selected as the output ports. For instance, scan-out shift operation corresponding to the test pattern structure may be performed at some scan channels, and from these scan channels scan output may be provided to the 12 output ports. It may be noted that the I/O ports, in addition to driving scan inputs and receiving scan outputs, must also provide test control signals like clocks, resets, scan enable, test mode values, etc. Accordingly, as such, in some implementations, some fewer than 32 I/O ports may actually be used for scan I/O ports.

The variable selection of each I/O port as either of the input port or the output port is performed based on at least one control signal. The at least one control signal may be generated from a control circuit, or any processing systems utilizing computer program instructions. In an example, a control circuit 250 may be configured in the DUT 200. Alternatively or additionally, the control circuit 250 may be a part of the testing system. The control signals may be generated based on a particular test pattern structure. In an embodiment, the control circuit 250 may be embodied within an application specific integrated circuit (ASIC) or a field programmable gate array (FPGA) specifically configured to perform a number of the operations, or a combination thereof, of the control circuit 250, such as in a manner described herein. In an embodiment, the control circuit 250 may also include memory devices (e.g., a cache), timing devices (e.g., a real-time clock (RTC)), an array of configurable logic blocks (CLBs), an array of programmable input/output blocks (IOBs) and/or additional circuitry or data transmission channels.

In an embodiment, the scan channels may also be selected as scan channels for performing scan-in shift operation and/or scan channels for performing scan-out shift operation based on the at least one control signal. In an embodiment, the control circuit 250 is configured to generate the control signals for selecting scan channels for performing the scan-in shift operation and/or the scan-out shift operation. For example, on a per test pattern structure basis, N number of scan channels of the N scan channels (total scan channels in the DUT) may be communicatively coupled with the M1 number of ports for performing scan-in shift operation; and N2 number of scan channels of the N scan channels may be communicatively coupled with the M2 number of ports for performing scan-out shift operation. For instance, if there are a total of 16 scan channels coupled to the I/O ports in the DUT, 10 scan channels may be selected for receiving the input test pattern (as scan-in channels for performing the scan-in shift operation), and the scan output may be taken from 6 scan channels. In this example, 10 scan channels may be communicatively coupled to those I/O ports that are selected for receiving the scan input corresponding to the test pattern structure, and the 6 scan channels may be communicatively coupled to those I/O ports that are selected for providing scan outputs corresponding to the test pattern structure.

In an embodiment, scan channels in the DUT may be grouped into a plurality of partitions. For example, if there are N number of scan channels (associated with M number of I/O ports), these scan channels may be grouped in a plurality of partitions (see, 210) of scan channels. For example, if there are 16 scan channels coupled to the 32 I/O ports in the DUT 200, the scan channels may be grouped in four partitions, where each partition comprises four scan channels. In various embodiments, the scan-in channels and scan-out channels may be dynamically selected from the 16 scan channels. A variable selection of scan-in channels and scan-out channels from the available scan channels based on the control signals, are provided in this embodiment of the present technology. It should be noted that N (number of scan channels) may be greater, or equal or less than M/2. For instance, in some cases, N may be equal to the M/2 where each scan channel is coupled to a pair of I/O port. In some forms, for example, in scan compressions, N may be greater than M/2. In scan compression implementations, M number of I/O ports may be remapped into a large number (N) of internal scan chains called STUMPS channels. Without loss of any generality, various embodiments of the present technology may be applicable to variable selection of scan channels (for performing scan-in shift operation and/or scan-out shift operation) in modes irrespective of whether scan compression is used in the DUT or not.

The DUT 200 includes a selection circuit 260 coupled to each of the N number of scan channels for configuring each scan channel as one of the scan-in channel and scan-out channel. In an embodiment, the selection circuit 260 is also configured to select the M1 number of ports and M2 number of ports from among the M number of I/O ports. The selection circuit 260 is coupled with the control circuit 250 for receiving the control signals generated corresponding to a test structure, such as a test cycle, a test pattern and/or a test mode. In an example, the selection circuit 260 may be coupled with each of the partitions of the scan channels in the DUT 200, and is configured to select one or more partitions at a time, and/or one or more scan channels within a selected partition.

In the embodiment shown in FIG. 2, the control signals may comprise an input partition selection signal, an output partition selection signal, and a channel selection signal.

Upon receiving the input partition selection signal (shown as 'signal 1'), the selection circuit 260 is configured to select a first set of partitions from the plurality of partitions of the scan channels for performing scan-in shift operation (i.e., scan channels of the selected partitions act as scan-in channels). For example, if there are four partitions (a total of 16 scan channels) in the DUT 200, the first set of partitions may include one, two, three or all four partitions of the total partitions that are selected based on the input partition selection signal. In an example, each of the four partitions (including 16 scan channels) may be selected for the scan-in shift operation. In another example, the first set of partitions may include 1, 2 or 3 partitions having 4, 8, or 12 scan channels, respectively. Accordingly, a desired number of partitions, and in turn, a desired number of scan channels, may be selected for performing the scan-in shift operation corresponding to the test pattern structure.

Upon receiving the channel selection signal (shown as 'signal 2'), the selection circuit 260 is configured to select scan channels from the first set of partitions (the already selected DUT partitions based on the input partition selection signal). For example, if 3 partitions of the scan channels (i.e., a total of 12 scan channels) are selected as the first set of partitions, some scan channels, for example, 9 scan channels may be selected for performing the scan-in shift operation for a current test pattern structure based on the channel selection signal. Similarly, a desired number of partitions from the first set of partitions may be selected for the scan-out shift operation. Additionally, in an embodiment, some partitions may also be selected (that need to be active) from the first set of partitions based on the channel selection signal. In an example, for each test structure (for example, for a cycle of shift operation or for a test pattern) selective partitions or selective scan channels inside a partition among the first set of partitions may be required to be active at a time. For instance, in a case, two partitions in the DUT 200 are selected as the first set of partitions, and only one partition is required for performing scan-in shift operation and the other partition is used for initialization only. In such a case, instead of utilizing both partitions for scan-in shift and scan-out shift (capture) operations, only one partition may be selected as the active partition. Further, in some scenarios, scan-in shift operation may be performed partially in a partition, for example, n/2 scan-in shift operations may be performed in scan channels of one partition and the remaining n/2 scan-in shift operations may be performed in scan channels of another partition (where n is the length of the scan-in shift operation).

Upon receiving the output partition selection signal, the selection circuit 260 is configured to select one or more partitions for performing the scan-out shift operation. It should be noted that based on the input partition selection signal, the selection circuit 260 is configured to select some or all partitions of the DUT for the scan-in shift operation, while based on the output partition selection signal, some partitions may be selected for the scan-out shift operation. It should be noted that selection of the partitions based on the output partition selection signal and the input partition selection signal may not be identical. For example, while scan-in shift operation may be enabled for all partitions based on the input partition selection signal, whereas, scan-out shift may be enabled for only one partition based on the output partition selection signal. Such enablement may be for achieving greater observability or for a diagnosis purposes. Also, some or all of the scan channels within a partition may be selected for shift-in and/or shift-out based on the control signals.

Figure 3:
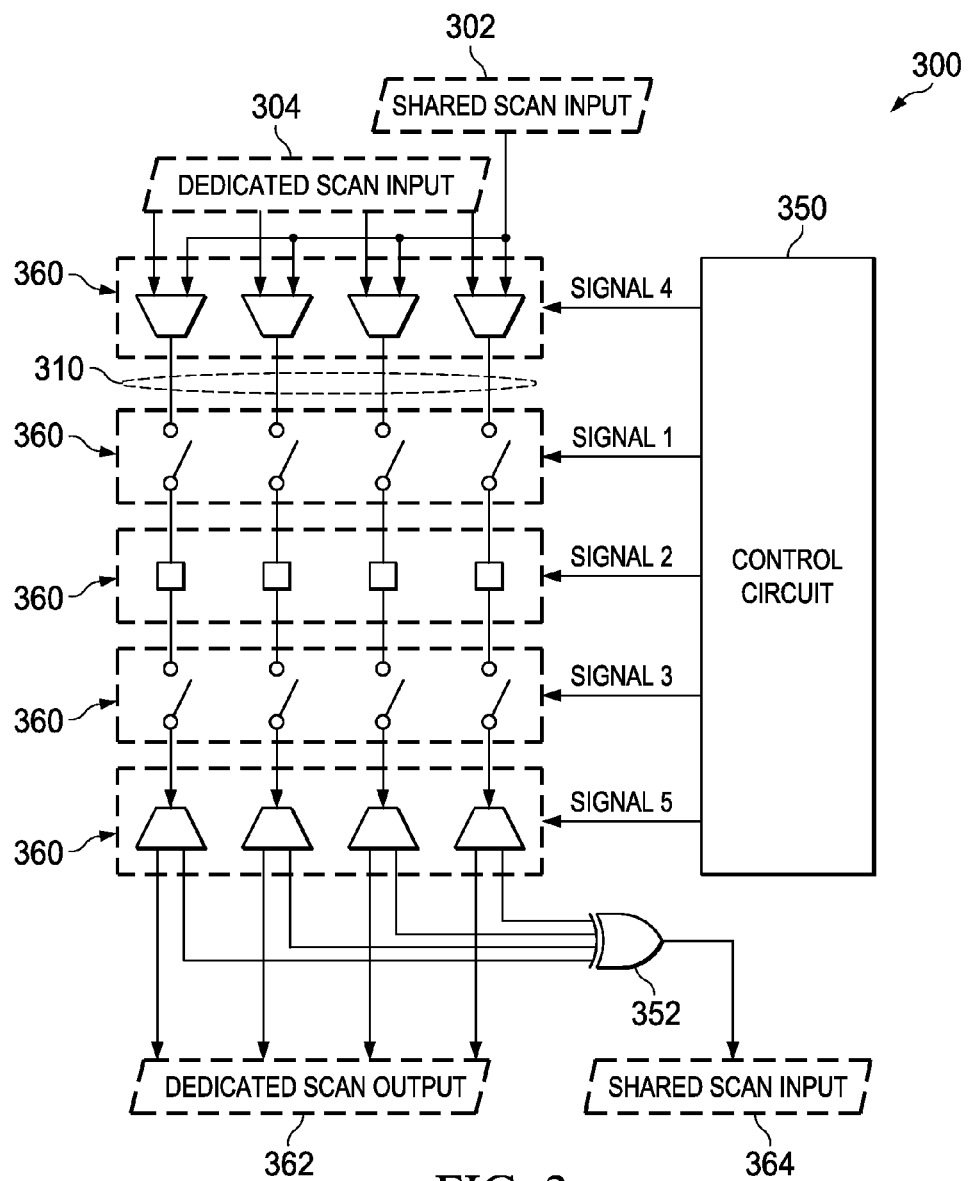
FIG. 3 illustrates an exemplary DUT in accordance with an exemplary embodiment of the present technology.

FIG. 3 illustrates an exemplary DUT 300, in accordance with an embodiment. The DUT 300 may have a plurality of scan channels associated with I/O ports. The I/O ports may be same as the I/O ports 120, as shown in reference to FIG. 1.

In this embodiment, the control signal (generated by a control circuit 350) may further include an input selection signal and an output selection signal, in addition to the input partition selection signal, the output partition selection signal, and the channel selection signal described in reference to FIG. 2. In an example, the control circuit 350 may be an example of the control circuit 250 in terms of configuration.

In this embodiment of FIG. 3, the test pattern structure (such as test pattern structure 202) may include at least one of shared scan input (see, 302) and dedicated scan input (see, 304). In an example, a shared scan input may be provided to each partition (see, 310) of the DUT 300. A dedicated scan input may be provided to a dedicated partition, and each partition may receive its dedicated scan input. In an example, the selection circuit 360 may include devices such as multiplexers to select one of a dedicated scan input corresponding to a partition and the shared scan input. For instance, in one form, four separate input streams of the dedicated scan input may be provided to each of the four partitions of the scan channels, that in turn drives 16 internal scan channels of the DUT 300. In another implementation, common input streams of the shared input test pattern may be provided to each of the four partitions driving the 16 internal scan channels of the DUT 300. It should be noted that in some other forms, the shared input test patterns and the dedicated input test pattern may be overlapping and the overlapped input stream of the test patterns may be provided simultaneously to the four partitions of the DUT 300.

The selection circuit 360 is configured to select at least one of the shared scan input and the dedicated scan input for each partition based on the input selection signal (see, signal 4). As already described in reference to FIG. 2 (with respect to the selection circuit 260), the selection circuit 360 is configured to receive the input partition selection signal, the channel selection signal and the output partition selection signal. In an example, upon receiving the input partition selection signal, the selection circuit 360 is configured to select one or more partitions of the scan channels for performing the scan-in shift operation corresponding to the current test pattern structure. Further, based on the receipt of the channel selection signal, the selection circuit 360 is configured to select partitions of the DUT 300 or selective scan channels inside a partition from the already selected partitions (the first set of partitions) based on the input partition selection signal. Furthermore, upon receiving the output partition selection signal, the selection circuit 360 is configured to select one or more partitions for performing the scan-out shift operation corresponding to the test pattern structure. Further, the selection circuit 360 is configured to select at least one of a dedicated scan output (see, 362) for each partition based on the output selection signal (see, signal 5) and a shared scan output (see, 364). In an implementation, multiple internal scan outputs can be internally compared or compacted (for example, exclusive OR gating (by an XOR gate 352 shown in FIG. 3) of multiple scan outputs may be performed to generate the shared scan output) to drive a single scan output (for example, the shared scan output 364) at the DUT 300. Alternately, multiple internal scan outputs may be driven individually to dedicated scan output ports of the DUT 300.

Based on various embodiments described in reference to FIGS. 2 and 3, it should be noted from total of M number of I/O ports, M1 number of ports may be selected as input port and M2 number of ports may be selected as output port for a particular test patter structure, where M1 and M2 may vary from 0 to M; and at any time instant while the scan testing, a sum of M1 and M2 is equal or less than M. Similarly, variable number of scan channels may be communicably coupled to the input ports and the output ports for performing scan-in shift and scan-out shift operation, respectively. For instance, N1 number of scan channels may be selected for performing the scan-in shift operation and N2 number of scan channels may be selected for performing scan-out shift operation. In an embodiment, the N1 number of scan channels may be communicatively coupled to the M1 number of input ports and the N2 number of scan channels may be communicatively coupled to the M2 number of output ports. In some examples, N1 and N2 may be greater, equal or less than M/2. For instance, in some implementations, N1 and N2 may be equal to or less than M/2. In some implementations, for example, in scan compression implementations of internal scan channels, N1 or N2 may be greater than M/2.

In some exemplary scenarios, the output ports of a DUT, such as, the DUTs 200 or 300 may not have required drive strength to drive a load associated with a connection between the output ports of the DUT and the testing system. For instance, the output ports are coupled to output buffers that drive the connection between the output ports and the corresponding ports of the testing system. In some scenarios, it may be desired that the number of required output buffers should be decreased or completely eliminated. In such scenarios, the scan output is not provided to the testing system from the output ports of the DUT, instead, the output ports are utilized to receive the expected scan output from the testing system, and the comparison of expected scan output and the actual scan output (received from the scan-out shift operation) is performed internally in the DUT. Such scan testing of the DUTs are further explained in reference to FIGS. 4 and 5A-5C.

Figure 4:
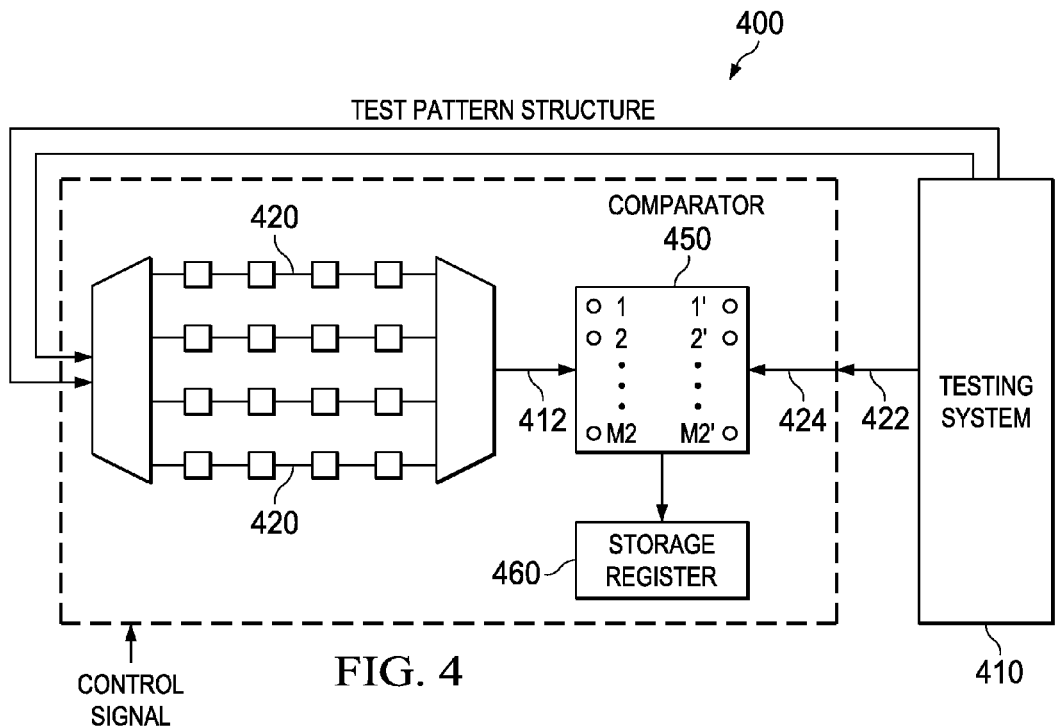
FIG. 4 illustrates an exemplary testing of a DUT in accordance with an exemplary embodiment of the present technology.

FIG. 4 illustrates an exemplary testing of a DUT 400, in accordance with an exemplary embodiment of the present technology. Apart from other applications, this embodiment may be utilized in cases, where there is not sufficient drive strength at the output ports of the DUT 400 for driving the connection between the output ports and the corresponding ports in a testing system 410. In the embodiment of FIG. 4, output ports (for example, 120, not shown in FIG. 4) of the DUT 400 may be used as input ports for receiving test pattern structures or expected scan output corresponding to the test pattern structures from the testing system 410. For instance, the testing system 410 may provide the test pattern structures to the input ports associated with the scan input channels of the DUT 400. The output ports associated with the scan output channels may receive the expected scan output corresponding to the test pattern structures from the testing system 410, instead of receiving scan outputs from the output ports. Accordingly, the need for driving the load of the connection between the output ports and the corresponding ports in the testing system (and also the need for the output buffers) may be eliminated.

In this embodiment, as an input (shown as 422) corresponding to the expected scan output (shown as 424) is received at the DUT 400 from the testing system 410, a comparison of the expected scan output (424) and the actual scan output (shown as 412) is performed internally in the DUT 400. Herein, as shown in FIG. 4, the actual scan output 412 is received from internal scan channels 420 of the DUT 400. It should be noted that this embodiment provides increased number of scan input channels from the testing system 410 without sacrificing the number of scan output ports or the ATPG efficiency. Further, this embodiment allows design simplification, as scan outputs must otherwise be, driven by high strength (and also high voltage) drivers (to account for the testing system 410 and associated board's loads). In this embodiment, the DUT 400 includes a comparator 450 coupled to the scan channels 420 (for receiving the actual scan outputs) and scan output ports (for receiving the expected scan output) of the DUT 400 in an internal connection configuration. It should be understood that the scan output ports of the DUT 400 act as input ports, as these ports receive the input 422 corresponding to the expected scan output from the testing system 410. In some embodiments, the input 422 may be same the expected scan output 424. In some embodiments, the comparison of the expected scan output 424 and the actual scan output 412 may need to be disabled, and accordingly, the input 422 may include the expected scan output 424 and one or more comparison enable signals for controlling (enabling/disabling) the comparison. Various comparator configurations are further described in reference to FIG. 5.

In an embodiment, the comparator 450 may have a first set of M2 inputs (shown as ranging from 1 to M2) capable of being coupled with the scan channels, and a second set of M2 inputs (shown as ranging from 1' to M2') capable of being coupled with the M2 number of ports (that are initially selected as output ports). In an embodiment, the M2 number of ports are capable of receiving expected scan output from the testing system, and these ports act as input ports. The testing system 410 provides test structure (such as a test pattern or a test cycle of the test pattern) at the M1 number of ports (selected as input ports) of the DUT 400. The scan output associated with the test pattern structure (provided at the N input ports of the DUT 400) is provided to the comparator 450. For instance, scan-in shift operation corresponding to the test pattern structure may be performed at the N1 number of scan channels, and the corresponding scan-out shift operation may be performed at the N2 number of scan channels. In an embodiment, the scan output from the N2 number of scan channels may be received at the first set of M2 inputs. The comparator 450 also has the second set of M2 inputs that are coupled to the M2 number of ports of the DUT 400 for receiving the expected scan output from the testing system 410. For example, the comparator 450 is configured to receive the expected scan output associated with the test pattern structure from the testing system 410. The comparator 450 is further configured to compare the scan output received from the N2 number of scan channels (received at the first set of M2 inputs) and the expected scan outputs (received at the second set of M2 inputs) to generate test result(s).

The DUT 400 also includes a storage register 460 for storing the test results based on the comparison of the actual scan output and the expected scan output. The storage register 460 may be a buffer or a memory capable of storing the test results in form of one or more bits. Example of the storage register 460 may include one or more flip-flops such as D flip-flop, or latches. In the embodiments, where the DUT has the comparator 450, the control signal may be a constant signal, and the value of the N1, N2, M1 and M2 may be once configured in the DUT based on the constant signal. For instance, based on an e-fuse technique, the N1, N2, M1 and M2 may be hard coded based on the constant signal.

The comparator 450 may be designed in various configurations, and is capable of handling scenarios where the DUT outputs may not be specified for some or all cycles of the test pattern structure. Examples of such scenarios include where the response is an "X" or unspecified value (either "0" or "1", but not predictable) due to uninitialized logic inside the DUT, or unresolved logic function (e.g. contention between two signal nets at opposite values), or either of the above because of the input data stream which feeds the scan input channels containing "don't care" values. In these scenarios, the corresponding scan channel outputs must not be compared since the output is not a determinate "0" or "1" value. Such outputs may be termed as "M" (indicating "to be masked"). In an embodiment, if the scan out data values include "M", it is excluded from comparison with the expected scan output by the comparator 450, besides the normal logic '1' bits and logic '0' bits that are required for comparison to ascertain the faulty/fault-free nature of the DUT 400. There may also be scenarios (for example, unknown states) where the scan output ought to be ignored and its comparison with an expected scan output needs to be avoided. An example of the unknown state in the DUT may include an instance, when the first scan pattern of a new pattern set is being shifted in, and the scan output of non-initialised scan flip-flops at the instance must be prevented from being compared. Further, in some scenarios, forced 'Ms' may be provided in the input test pattern to ensure pattern robustness, and a comparison is not desired in such scenarios.

Various configurations of the comparators 450 are capable of determining the instance when the comparison of the scan output and the expected scan output must be prevented, and these embodiments are described in reference to FIGS. 5A-5C.

FIGS. 5A, 5B and 5C illustrate examples of configurations of comparators in accordance with various embodiments of the present technology. Some examples of the comparator 450 such as comparators 510, 530 and 550 are shown in FIGS. 5A, 5B and 5C, respectively.

In the embodiment of FIG. 5A, the comparator 510 receives the scan output (see, 512) from the scan channels of a DUT such as the DUT 400, and receives the expected scan output (see, 514) from a testing system such as the testing system 410. In this embodiment, a compare enable input (see, 516) is provided from the testing system to the comparator 510. In an embodiment, the comparison of the scan output and the expected scan output 514 is enabled or disabled based on the compare enable input 516.

The embodiment of the FIG. 5A may be configured by providing two scan input ports for each output port in the DUT. For instance, each scan output port of the DUT is replaced with two input ports driven from testing system, and the two input ports are coupled with the testing system. A first scan input port (configured for each output port) is configured to receive the expected scan output 514 from the testing system, and the second scan input port (configured for the each output port) is configured to receive the compare enable signal 516. In an example, if the compare enable signal is asserted (for example, logic '1'), the comparison is enabled and the scan output and the expected scan output may be compared by the comparator 510. Further, if the compare enable signal is de-asserted (for example, logic '0'), the comparison is disabled and the comparison of the scan output and the expected scan output is prevented in the comparator 510.

In the embodiment of FIG. 5B, the comparator 520 receives the scan output (see, 512) from the scan channels of a DUT, such as the DUT 400, and receives an input (see, 522) comprising expected scan output and a comparison enable signal from the testing system. In this embodiment, the input 522 comprising the compare enable signal and the expected scan output are provided at a clock having frequency twice of a clock of the scan output from the DUT.

In this embodiment, two cycles of the input 522 is provided to the ports of the DUT for each cycle of scan output 512, where at a first cycle, the input 522 corresponds to a compare enable input, and at the second cycle, the input 522 corresponds to the expected scan output. In an embodiment, if the input 522 at the first cycle (i.e., the compare enable input) indicates that a comparison is valid (for example, input provided by the testing system in the first cycle is logic '1'), the input 522 at the succeeding cycle (the second cycle) is used for comparison with the scan output data. Further, in an example, if a value of the input 522 in the first cycle indicates that a comparison is not valid (for example, input 522 provided by the testing system in the first cycle is logic '0'), the input 522 in the succeeding cycle (the second cycle) is not used/prevented for comparison with the scan output data. As shown in the FIG. 5B, the input 522 may be provided to a de-multiplexer 524 having a toggling select line (see, sel) which provides one of the expected scan output (see, 516) and the compare enable input (see, 514), at a particular clock cycle. Accordingly, it should be noted that the comparison of the expected scan output 516 and the scan output 512 is performed at a clock cycle based on the compare enable input at a preceding clock cycle.

In the embodiment of FIG. 5C, the comparator 530 receives the scan output 512 from the output of the scan channels of a DUT, such as the DUT 400. In this embodiment, an input 532 provided to the comparator 530 (from the testing system) is considered as a compare enable signal. The input 532 received from the testing system is interpreted only as a compare enable signal and the value to be compared against is fixed, for example, 1 or 0. In this embodiment, the test pattern is applied twice to the scan-in channels through the input ports of DUT, and the comparisons of the scan outputs to the fixed '1's or '0's are performed in two passes. In the first pass, only valid '1's are compared; and in the second pass, only valid '0's are compared. In this embodiment, don't care inputs (X) or "M" values are ignored for comparison in both the passes. In this embodiment, only one input port is required to be configured for the original output port in the DUT. The two modes (for example, two passes) may be set through a test mode register control (in one application the input 532 to the comparator is set to 1, and in the second application the input 532 is set to 0). The input 532 provided by the testing system, at every cycle, is used to enable or disable the comparison.

Various other embodiments of the present technology provide other possible ways of implementation of the comparator. For instance, in one implementation, a specific signal can be generated internally in the DUT corresponding to specific scan test cycles in which the scan output comparison must be disabled. This can be enabled based on a test mode control write sequence (e.g., at specific instances inside the Tester Description Language (TDL) that is used to describe test patterns to be applied by the testing system to the DUT) or through an internally generated signal, (i.e., in specific cycles, e.g., scan I/O pipeline flush).

Figure 6:
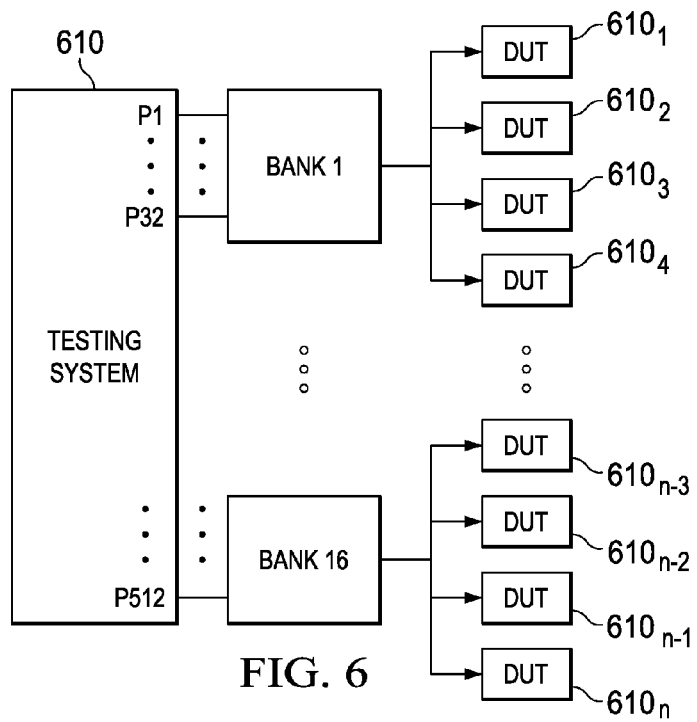
FIG. 6 is a schematic representation of an exemplary connection of a testing system and a number of DUTs in a multi-site scan testing paradigm in accordance with an embodiment of the present technology.

The embodiment of FIG. 4 and the various configurations of the comparator provided in FIGS. 5A, 5B and 5C may be utilized in a testing environment, where multiple dies (DUTs) on a wafer may be tested simultaneously. Referring now to FIG. 6, an exemplary representation (a schematic connection of a testing system 610 and DUTs 620₁, 620₂, . . . and 620n) of such testing environment is represented, in accordance with an exemplary embodiment.

In an example, it may be assumed that the testing system 610 comprises P number of ports that are partitioned in I number of banks. For example, the testing system 610 may have 512 ports (shown as P1, P2 . . . P512) for providing test pattern structures though corresponding scan lines. In this example, the scan lines corresponding to the 512 ports are divided in 16 banks (shown as Bank 1, . . . Bank 6), where each bank comprises 32 scan lines for providing test patterns to one or more DUTs of the DUTs (shown as $620_1$, $620_2$, . . . , $620_n$). For example, each bank may be capable of providing test pattern structures to a DUT having 32 I/O ports (including ports for receiving scan input and ports for providing scan output). However, if each of the DUTs have N (for example, 8) I/O ports, J number of such DUTs (for example, J is equal to four, where each of the four DUTs may have less than or equal to 8 I/O ports) may be tested simultaneously utilizing each bank of the testing system 610. For example, the bank 1 is coupled (for providing test pattern structures) to four DUTs such as DUT $620_1$, DUT $620_2$, DUT $620_3$ and $620_4$. Similarly, other banks such as bank 16 is coupled to four DUTs such as DUT $620_{n-3}$, DUT $620_{n-2}$, DUT $620_{n-1}$ and $620_n$.

In this example, each of the four DUTs corresponding to each bank of the testing system 610 may be tested for a test pattern structure, and corresponding test results are stored in registers (for example, the storage register 460) provided in the each DUT. For instance, the scan-in shift operation of the test pattern may be performed at four scan channels of each DUT. Scan outputs from the scan channels (performing the scan-out shift operation) of each DUT is provided to the comparator present in the each DUT. As described in reference to FIG. 4, the comparator receives the expected scan output from the testing system through some of the output ports (that act as input ports for receiving the expected scan output). The comparator is further configured to compare the scan output with the expected scan output to determine any fault or for diagnosis of the each DUT.

In this embodiment, each of the J number of DUTs (e.g., four DUTs) are tested through a bank of the testing system such that for each test pattern structure, scan testing is prevented from discontinuing before completion of the scan-in shift operation and the storage of the test results for each of the J number of DUTs. For example, the scan testing is prevented from discontinuing upon determination of a fault based on a test result associated with a DUT of the J number of DUTs, until the test results are stored for each of the J number of DUTs. For instance, if scan testing of the four DUTs such as DUTs $620_1$, $620_2$, $620_3$ and $620_4$ is performed utilizing a bank 1 of the testing system 610 and a fault is detected in the DUT $620_2$ for a current test pattern structure (for example, for a current test cycle), the scan testing corresponding to the current test pattern structure is not discontinued until scan testing of each of the DUTs $620_1$, $620_2$, $620_3$ and $620_4$ is completed. In one form, test results corresponding to each DUT $620_1$, $620_2$, $620_3$ and $620_4$ are stored in the storage register, and only after the completion of the scan testing of each of the DUTs $620_1$, $620_2$, $620_3$ and $620_4$, test results are analyzed to determine any faults in the DUTs $620_1$, $620_2$, $620_3$ and $620_4$. Accordingly, it should be noted that testing of each DUT (of J number of DUTs) associated with a bank is completed (not discontinued) in a test cycle, irrespective of any determination of fault in any of the J number of DUTs. For instance, all DUTs are tested, and the test result (whether faulty or not-faulty) corresponding to the each DUT is stored, and the testing of the DUTs are completed without any interruption.

The flowchart diagrams that follow are generally set forth as logical flowchart diagrams. The depicted operations and sequences thereof are indicative of at least one embodiment of the present disclosure. It should be appreciated, however, that the scope of the present disclosure includes methods that use other operations and sequences, and methods that are useful or similar in function, logic, or effect. Also, while various arrow types, line types, and formatting styles may be employed in the flowchart diagrams, they are understood not to limit the scope of the corresponding method(s). In addition, some arrows, connectors and other formatting features may be used to indicate the logical flow of the methods. For instance, some arrows or connectors may indicate a waiting or monitoring period of an unspecified duration. Accordingly, the specifically disclosed operations, sequences, and formats are provided to explain the logical flow of the methods and are understood not to limit the scope of the present disclosure.

Figure 7:
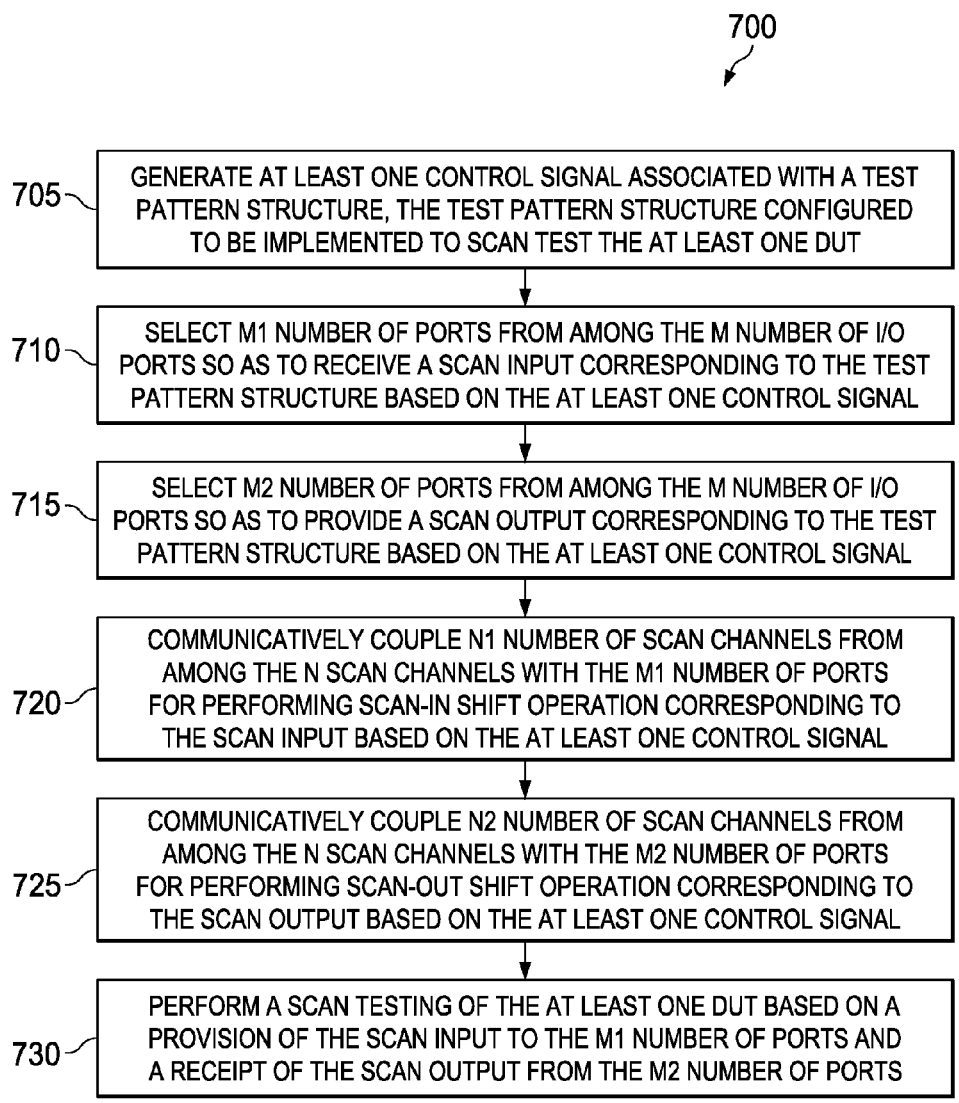
FIG. 7 illustrates a flow diagram of an exemplary method of testing DUTs in accordance with an embodiment of the present technology.

FIG. 7 illustrated a flow diagram of a method 700 for testing of devices under test (DUTs), in accordance with an embodiment of the present technology. In an example, the method 700 may be performed by a testing system such as the testing system 150, 410 and 610 and/or one or more DUTs such as DUTs 120, 200, 300, 400 and $620_1$-$620_n$. As described in foregoing FIGS. 1 to 6, a DUT may comprise N number of scan channels associated with M number of Input/Output (I/O) ports.

At 705, the method 700 includes generating at least one control signal associated with a test pattern structure. Examples of the test pattern structure may include, but are not limited to, a test pattern, a test cycle of the test pattern or a test mode. The test pattern structure is received from a testing system for scan testing of the at least one DUT. At 710, the method 700 includes selecting M1 number of ports from among the M number of I/O ports for receiving scan input based on the at least one control signal. In an example, M1 may vary from 0 to M. At 715, the method 700 includes selecting M2 number of ports from among the M number of I/O ports for receiving scan output at least one control signal, wherein M2 varies from M to 0. In an example, at any time instant while the scan testing corresponding to the scan pattern structure, a sum of M1 and M2 is less than or equal to M.

In an embodiment, at 720, the method 700 may optionally include communicatively coupling N1 number of scan channels (selected from among the N number of scan channels) with the M1 number of ports for performing scan-in shift operation based on the at least one control signal. In an embodiment, at 725, the method 700 may optionally include communicatively coupling N2 number of scan channels (selected from among the N number of scan channels) with the M2 number of ports for performing scan-out shift operation based on the at least one control signal. In an embodiment, N may vary from 0 to N, N2 may vary from N to 0, and the values of N1 and N2 may be less, greater or equal to M/2 depending upon various implementations and the hook-up configuration of the internal scan chains to the I/O ports of the DUT.

In an embodiment, the communicatively coupling the N1 scan channels with the M1 number of ports (that are selected for receiving scan input) for the scan-in shift operation and the communicatively coupling N2 scan channels with M2 number of ports (that are selected for providing scan output) for the scan-out shift operation are performed based on the control signals. In an embodiment, the control signals may be generated from a control circuit, or any processing systems utilizing computer program instructions. In an example, the control circuit may be configured in the DUT. Alternatively or additionally, the control circuit may be a part of the testing system. The control signals may be generated based on a particular test pattern and/or a test mode.

In an embodiment, the control signals may comprise an input partition selection signal, an output partition selection signal, and a channel selection signal. As described in reference to FIGS. 2 and 3, scan channels of the DUT may be grouped into a plurality of partitions. In an embodiment, the method 700 may include selecting a first set of partitions from the plurality of partitions for the scan-in shift operation based on the input partition selection signal. In an embodiment, the method 700 may also include selecting one or more partitions of the first set of partitions based on the channel selection signal. In this embodiment, the method 700 may also include selecting one or more channels of the first set of partitions for the scan-in shift operation. Accordingly it should be noted that the method 700 is capable of dynamically selecting scan channels for performing scan-in shift operation and/or the scan-out shift operation, and the scan channels may be dynamically selected on a per test mode and on a per test cycle basis.

In some embodiments, the test pattern structure may include at least one of a shared scan input test pattern and dedicated scan input test patterns corresponding to the plurality of partitions. As described in reference to FIG. 3, the shared scan input may be a common input provided to each partition and a dedicated scan input may be provided to a corresponding partition of the plurality of partitions.

In an embodiment, the control signals may further include an input selection signal and an output selection signal, in addition to the input partition selection signal, the output partition selection signal, and the channel selection signal. The method 700 may further include selecting at least one of the shared scan input and the dedicated scan input for each partition based on the input selection signal. Furthermore, the method 700 includes selecting one or more partitions for performing the scan-out shift operation upon receiving the output partition selection signal. Further, the method 700 includes selecting at least one of a shared output and a dedicated output for each partition based on the output selection signal.

At 730, the method 700 includes performing scan testing of the at least one DUT based on providing the scan input to the M1 number of ports and receiving the scan output from the M2 number of ports. As explained above, the scan testing of the at least one DUT includes scan-in shift operation performed at the N1 number of scan channels and the scan-out shift operation performed at the N2 number of scan channels. In some embodiments, the method 700 includes providing the scan input corresponding to the test pattern structure at the N1 number of scan channels. Further, the method 700 includes providing scan output received from the N2 number of scan channels to a comparator configured in the DUT. The method 700 further includes providing expected scan output corresponding to the test pattern structure from the testing system to the comparator through N2 number of output ports of at least one DUT. Furthermore, the method 700 includes comparing the scan output associated with the N2 number of scan channels and the expected scan output received through the N2 number of output ports to generate a test result corresponding to the test pattern structure. Thereafter, the method 700 includes storing the test result corresponding to the test pattern structure.

Based on various embodiments described in reference to FIGS. 2 to 7, it should be noted from total number of I/O ports (for example, M), 0 to M number of I/O ports may be selected as either input or output ports. At a particular time instance during scan testing of the DUT, sum of number of input and output ports may be less than or equal to the total number of I/O ports (for example, M). Similarly, from N number of scan channels (for example, N), 0 to N scan channels may be selected as scan-in channels, and the 0 to N scan channels may be selected as the scan-out channels, based on the scan pattern structure.

Without in any way limiting the scope, interpretation, or application of the claims appearing below, a technical effect of one or more of the exemplary embodiments disclosed herein is to dynamically select input ports, output ports, and scan channels for performing scan-in shift and scan-out shift operation. The input ports, output ports, and scan channels may be dynamically allocated on per test pattern, per test cycle or a par test mode basis. Implementation of various embodiments is capable of improving ATPG efficiency for controllability, observability, diagnosability, and test concurrency in the presence of multiple cores with different scan in/scan out requirements. Further, testing time is reduced considerably as redundant scan-in/scan-out operations are not required to be performed for reasons of symmetry based on the dynamic selection of ports and scan channels during the scan testing. Further, various embodiments provide mechanism for scan testing where there are drive strength limitation in the DUTs for driving the output load between testing systems and DUTs by providing comparison of the scan output and the expected scan output internally in the DUTs.

Although the present technology has been described with reference to specific exemplary embodiments, it is noted that various modifications and changes may be made to these embodiments without departing from the broad spirit and scope of the present technology. For example, the various systems, modules, etc., described herein may be enabled and operated using hardware circuitry (e.g., complementary metal oxide semiconductor (CMOS) based logic circuitry), firmware, software and/or any combination of hardware, firmware, and/or software (e.g., embodied in a machine readable medium). For example, the various modules and methods may be embodied using transistors, logic gates, and electrical circuits (e.g., application specific integrated circuit (ASIC) circuitry and/or in Digital Signal Processor (DSP) circuitry).

Particularly, the control circuits 250 or 350 of FIGS. 2 and 3 may be enabled using software and/or using transistors, logic gates, and electrical circuits (e.g., integrated circuit circuitry, such as, for example, ASIC circuitry). Embodiments of the present disclosure include one or more computer programs stored or otherwise embodied on a computer-readable medium, wherein the computer programs are configured to cause a processor to perform one or more operations, for method 700. A computer-readable medium storing, embodying, or encoded with a computer program, or similar language, may be embodied as a tangible data storage device storing one or more software programs that are configured to cause a processor to perform one or more operations. Such operations may be, for example, any of the steps or operations described herein. Additionally, a tangible data storage device may be embodied as one or more volatile memory devices, one or more non-volatile memory devices, and/or a combination of one or more volatile memory devices and non-volatile memory devices.

Also, techniques, subsystems and methods described and illustrated in the various embodiments as discrete or separate may be combined or integrated with other systems, modules, techniques, or methods without departing from the scope of the present technology. Other items shown or discussed as directly coupled or connected with one another, or as directly communicating with each other, may be communicatively associated through some interface or device, such that the items may no longer be considered directly coupled or connected with one another, or directly communicating with each other, but may still be indirectly communicatively associated and in communication, whether electrically, mechanically, or otherwise, with one another. Other examples of changes, substitutions, and alterations ascertainable by one skilled in the art, upon studying the exemplary embodiments disclosed herein, may be made without departing from the spirit and scope of the present technology.

It should be noted that reference throughout this specification to features, advantages, or similar language does not imply that all of the features and advantages should be or are in any single embodiment. Rather, language referring to the features and advantages may be understood to mean that a specific feature, advantage, or characteristic described in connection with an embodiment may be included in at least one embodiment of the present technology. Thus, discussions of the features and advantages, and similar language, throughout this specification may, but do not necessarily, refer to the same embodiment. Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions may be apparent and well within the spirit and scope of the technology.

Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. A method of testing devices under test (DUTs), at least one DUT comprising N number of scan channels associated with M number of Input/Output (I/O) ports, the method comprising:
    generating at least one control signal associated with a test pattern structure, the test pattern structure configured to be implemented to scan test the at least one DUT;
    selecting M1 number of ports from among the M number of I/O ports so as to receive a scan input corresponding to the test pattern structure based on the at least one control signal;
    selecting M2 number of ports from among the M number of I/O ports so as to provide a scan output corresponding to the test pattern structure based on the at least one control signal, each of M1 and M2 being a number selected from among a range of numbers between 0 and M, and a sum of M1 and M2 being less than or equal to M; and
    performing a scan testing of the at least one DUT based on a provision of the scan input to the M1 number of ports and a receipt of the scan output from the M2 number of ports.

2. The method as claimed in claim 1, further comprising:
    communicatively coupling N1 number of scan channels from among the N number of scan channels with the M1 number of ports for performing scan-in shift operation corresponding to the scan input based on the at least one control signal; and
    communicatively coupling N2 number of scan channels from among the N number of scan channels with the M2 number of ports for performing scan-out shift operation corresponding to the scan output based on the at least one control signal.

3. The method of claim 2, wherein the at least one control signal comprises an input partition selection signal, an output partition selection signal, and a channel selection signal, and wherein the N number of scan channels are grouped in a plurality of partitions.

4. The method of claim 3, further comprising:
    selecting a first set of partitions from the plurality of partitions based on the input partition selection signal for performing the scan-in shift operation;
    selecting, based on the channel selection signal, at least one of:
        one or more scan channels of the first set of partitions for the scan-in shift operation; and
        one or more scan channels of the first set of partitions for the scan-out shift operation; and
    selecting a second set of partitions from the plurality of partitions based on the output partition selection signal for performing the scan-out shift operation.

5. The method of claim 4, wherein the at least one control signal comprises an input selection signal and an output selection signal, and wherein the test pattern structure comprises at least one of the shared scan input and a plurality of dedicated scan inputs corresponding to the plurality of partitions, and wherein the method further comprises:
    selecting at least one of a shared scan input of the test pattern structure and a dedicated scan input of the test pattern structure for each partition based on the input selection signal, the shared scan input being a common input provided to each partition and the plurality of dedicated scan inputs being capable of provided to the plurality of partitions; and
    selecting at least one of a shared scan output corresponding to the scan output and a dedicated output corresponding to the scan output from each partition based on the output selection signal.

6. The method of claim 1, wherein the at least one DUT comprises a comparator having a first set of M2 inputs capable of being communicatively coupled with the N2 number of scan channels, and a second set of M2 inputs capable of being communicatively coupled with the M2 number of ports, the M2 number of ports capable of receiving expected scan output from a testing system, and wherein testing the at least one DUT further comprises:
    providing the scan output corresponding to the test pattern structure to the first set of M2 inputs of the comparator, the scan output received from the N2 number of scan channels;
    providing expected scan output corresponding to the test pattern structure to the second set of M2 inputs of the comparator;
    comparing the scan output provided to the first set of M2 inputs and the expected scan output provided to the second set of M2 inputs to generate a test result; and
    storing the test result.

7. The method as claimed in claim 6, further comprising:
    providing a comparison enable input to the comparator, wherein the comparison of the scan output and the expected scan output is enabled or disabled based on the comparison enable input.

8. The method as claimed in claim 6, further comprising:
    providing, from the testing system, an input comprising a comparison enable input and the expected scan output at a clock having twice of frequency of a clock associated with the scan-out shift operation, wherein the comparison of the expected scan output and the scan output is performed at a clock cycle based on the comparison enable input at a preceding clock cycle.

9. The method of claim 6, wherein the testing system comprises P number of ports partitioned in I number of banks, each bank associated with P/I number of ports, each bank capable of testing J number of DUTs, each of the J number of DUTs comprising the comparator having the first set of M2 inputs and the second set of M2 inputs, and wherein the testing of the J number of DUTs in a bank comprises:
    comparing the scan output provided to the first set of M2 inputs and the expected scan output provided to the second set of M2 inputs of the comparator of the each of the J number of DUTs, to generate a test result; and
    storing the test result associated with the each DUT in a register associated with the each DUT upon comparison of the scan output and the expected scan output, wherein the scan testing is performed for the J number of DUTs such that the scan testing is prevented from discontinuing upon determination of a fault based on a test result associated with a DUT of the J number of DUTs before the test results are stored for each of the J number of DUTs.

10. The method of claim 1, wherein the at least one control signal is at least one of:
  a constant signal; and
  a signal generated from the testing system or the at least one DUT.

11. A Device Under test (DUT) capable of being scan tested by a testing system, the DUT comprising:
  M number of Input/Output (I/O) ports, each I/O port from among the M number of I/O ports configured to receive a scan input corresponding to a test pattern structure and provide a scan output corresponding to the test pattern structure;
  a plurality of scan channels coupled with the M number of I/O ports and configured to receive the scan input and provide the scan output; and
  a selection circuit coupled with each I/O port from among the M number of I/O ports and each scan channel from among the plurality of scan channels, the selection circuit configured to:
    select M1 number of I/O ports from among the M number of I/O ports to receive the scan input based on at least one control signal, and
    select M2 number of I/O ports from among the M number of I/O ports to provide the scan output based on the at least one control signal, each of M1 and M2 being a number selected from among a range of numbers between 0 and M, and a sum of M1 and M2 being less than or equal to M.

12. The DUT as claimed in claim 11, wherein the selection circuit is further configured to:
  communicatively coupling N number of scan channels from among the N number of scan channels with the M1 number of ports for performing scan-in shift operation corresponding to the scan input based on the at least one control signal; and
  communicatively coupling N2 number of scan channels from among the N number of scan channels with the M2 number of ports for performing scan-out shift operation corresponding to the scan output based on the at least one control signal.

13. The DUT of claim 12, wherein the at least one control signal comprises an input partition selection signal, an output partition selection signal, and a channel selection signal, and wherein the N number of scan channels are grouped in a plurality of partitions.

14. The DUT of claim 13, further comprising:
  selecting a first set of partitions from the plurality of partitions based on the input partition selection signal for performing the scan-in shift operation;
  selecting, based on the channel selection signal, at least one of
    one or more scan channels of the first set of partitions for the scan-in shift operation, and
    one or more scan channels of the first set of partitions for the scan-out shift operation; and
  selecting a second set of partitions from the plurality of partitions based on the output partition selection signal for performing the scan-out shift operation.

15. The DUT of claim 14, wherein the at least one DUT comprises a comparator having a first set of M2 inputs capable of being communicatively coupled with the N2 number of scan channels, and a second set of M2 inputs capable of being communicatively coupled with the M2 number of ports, the M2 number of ports capable of receiving expected scan output from the testing system, and wherein testing the at least one DUT further comprises:
  providing the scan output corresponding to the test pattern structure to the first set of M2 inputs of the comparator, the scan output received from the N2 number of scan channels;
  providing expected scan output corresponding to the test pattern structure to the second set of M2 inputs of the comparator;
  comparing the scan output provided to the first set of M2 inputs and the expected scan output provided to the second set of M2 inputs to generate a test result; and
  storing the test result.

16. The DUT of claim 11, further comprising:
  a control circuit for generating the at least one control signal based on the test pattern structure.

17. The DUT as claimed in claim 15, wherein the comparator is configured to receive a comparison enable input for enabling or disabling the comparison of the scan output and the expected scan output.

18. A testing system for scan testing of Devices Under Tests (DUTs), at least one DUT comprising N number of scan channels associated with M number of Input/Output (I/O) ports, the testing system comprising:
  a control circuit configured to generate at least one control signal based on a test pattern structure, the test pattern structure configured to be implemented to perform a scan testing of the at least one DUT, and the at least one control signal configured to enable:
    a selection of M1 number of I/O ports from among the M number of I/O ports to receive a scan input corresponding to the test pattern structure based on the at least one control signal, and
    a selection of M2 number of ports from among the M number of I/O ports to provide a scan output corresponding to the test pattern structure based on the at least one control signal, each of M1 and M2 being a number selected from among a range of numbers between 0 and M, and a sum of M1 and M2 being less than or equal to M, such that the scan testing is configured to be performed based on a provision of the scan input to the M1 number of ports and a receipt of the scan output from the M2 number of ports.

19. The testing system of claim 18, wherein the at least one control signal causes the selection circuit in the at least one DUT to further perform:
  communicatively coupling N number of scan channels from among the N number of scan channels with the M1 number of ports for performing scan-in shift operation corresponding to the scan input based on the at least one control signal; and
  communicatively coupling N2 number of scan channels from among the N number of scan channels with the M2 number of ports for performing scan-out shift operation corresponding to the scan output based on the at least one control signal.

20. The testing system of claim 19, wherein the at least one control signal comprises an input partition selection signal, an output partition selection signal, and a channel selection signal, and wherein the N number of scan channels are grouped in a plurality of partitions.

* * * * *